United States Patent [19]

Hatada et al.

[11] Patent Number: 5,077,601

[45] Date of Patent: Dec. 31, 1991

[54] COOLING SYSTEM FOR COOLING AN ELECTRONIC DEVICE AND HEAT RADIATION FIN FOR USE IN THE COOLING SYSTEM

[75] Inventors: Toshio Hatada; Takayuki Atarashi, both of Tsuchiura; Takahiro Daikoku, Ushiku, all of Japan; Satomi Kobayashi, New York, N.Y.; Shizuo Zushi, Hadano, Japan; Fumiyuki Kobayashi, Sagamihara, Japan; Susumu Iwai, Hadano, Japan

[73] Assignee: Hitachi, Ltd., Tokyo, Japan

[21] Appl. No.: 404,350

[22] Filed: Sep. 7, 1989

[30] Foreign Application Priority Data

Sep. 9, 1988 [JP] Japan .................................. 63-224653
Sep. 19, 1988 [JP] Japan .................................. 63-232468
Jun. 2, 1989 [JP] Japan .................................. 1-140876

[51] Int. Cl.[5] ..................... H01L 23/02; H01L 25/04; H02B 1/00; H05K 7/20
[52] U.S. Cl. ................................. 357/81; 361/381; 361/389; 165/80.3; 174/15.1; 357/82
[58] Field of Search ................. 357/82, 81; 174/15.1, 174/16.1; 361/381, 382, 383, 385, 389; 165/80.3, 80.4

[56] References Cited

U.S. PATENT DOCUMENTS

| | | | |
|---|---|---|---|
| 4,335,781 | 6/1982 | Duffy | 165/1 |
| 4,730,233 | 3/1988 | Osterman | 361/383 |
| 4,765,397 | 8/1988 | Chrysler | 165/104.33 |
| 4,859,520 | 8/1989 | Dubuisson et al. | 428/137 |

FOREIGN PATENT DOCUMENTS

| | | | |
|---|---|---|---|
| 3609083 | 9/1987 | Fed. Rep. of Germany | 357/81 |
| 2500215 | 8/1982 | France | 357/81 |
| 216606 | 12/1984 | German Democratic Rep. | 357/82 |
| 54-8469 | 1/1979 | Japan | 357/81 |
| 60-234349 | 11/1985 | Japan | |

OTHER PUBLICATIONS

Staver Co. Advertisement, 'Thermo-Vanes', *Electronic Design,* Jul. 5, 62, p. 16.

*Primary Examiner*—Andrew J. James
*Assistant Examiner*—Stephen D. Meier
*Attorney, Agent, or Firm*—Antonelli, Terry, Stout & Kraus

[57] ABSTRACT

A cooling system for cooling an electronic device by allowing a cooling fluid to flow in contact with heat generating components such as LSI chips of the electronic device arranged in series along the major flow of the cooling fluid. The cooling system has heat radiation fins attached to the heat-generating components, and a cooling duct defining a cooling fluid flow passage in which assemblies composed of the heat-generating components and the heat radiation fins are disposed. The flow passage has, at the upstream end of the upstream end assembly, a cross-sectional area greater than that of the assembly when taken in a plane perpendicular to the direction of the major flow of the cooling fluid. The cross-sectional area of the flow passage progressively decreases towards the downstream end, whereby the flow passage is divided into a main passage through which a main flow component of the cooling fluid directly flows into the series of assemblies and an auxiliary passage through which an auxiliary component of the cooling fluid flows substantially vertically towards the heat-generating component to impinge upon the heat generating component.

7 Claims, 18 Drawing Sheets

F I G. 16
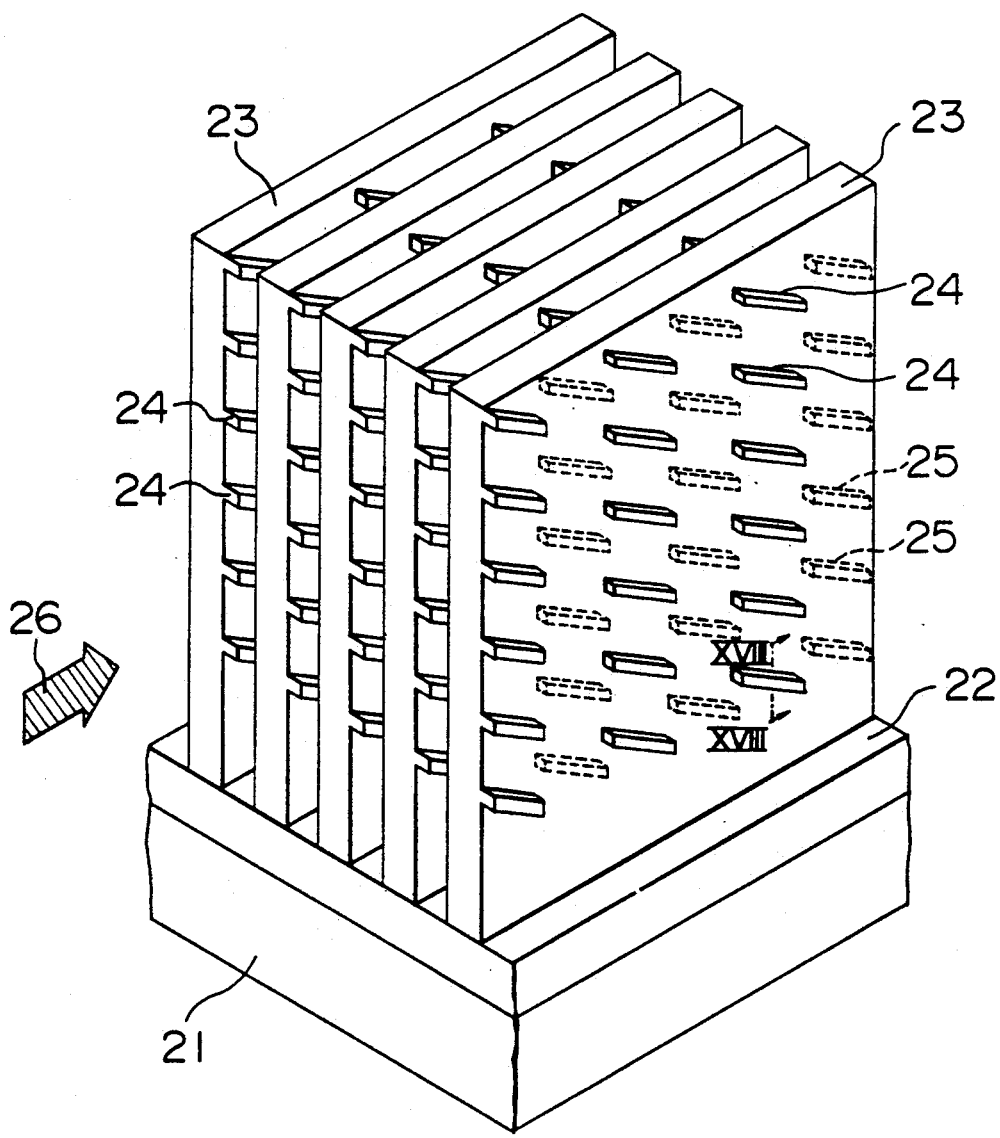

FIG. 18 　　FIG. 19 　　FIG. 20
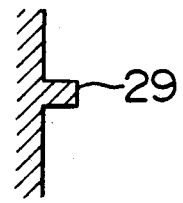 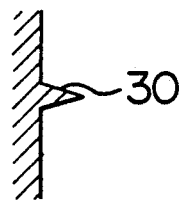 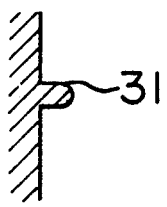
FIG. 21
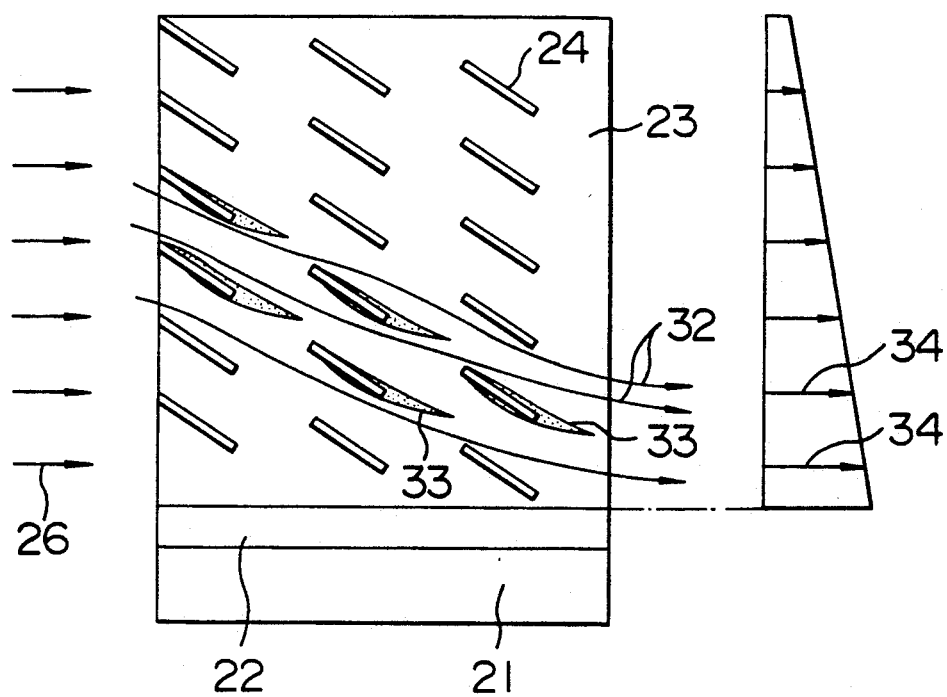

COOLING SYSTEM FOR COOLING AN ELECTRONIC DEVICE AND HEAT RADIATION FIN FOR USE IN THE COOLING SYSTEM

BACKGROUND OF THE INVENTION

1. Field of the Invention

The present invention relates to a cooling system for cooling an electronic device such as a computer having components which generate heat during operation.

2. Description of the Related Art

Hitherto, various cooling systems have been proposed for cooling electronic devices. For instance, Japanese Patent Unexamined Publication No. 59-11654 discloses a cooling system which has a cooling air duct for cooling a semiconductor device, a by-pass duct extending in parallel with the cooling air duct, and a by-pass air supply port provided at a predetermined portion of the by-pass duct and opening to the cooling air duct.

Japanese Patent Unexamined Publication No. 63-84100 discloses a cooling system in which a partition wall is provided to form a by-passing flow of cooling air, the partition wall being provided at predetermined portions with apertures to concentate cooling air to devices which have specifically large heat generating rates. Japanese Utility Model Unexamined Publication No. 62-65895 discloses a system in which an air introduction or discharge mechanism is provided in a portion of a side wall of a cooling air passage so as to enable introduction of ambient air In a cooling system disclosed in Japanese Utility Model Unexamined Publication No. 62-192696, vent holes are formed in a plurality of printed boards which are arranged at a predetermined spacing. Japanese Patent Unexamined Publication No. 55-108800 discloses an arrangement in which an air flow regulator, i.e., a flow resistance member, having a plurality of apertures is placed at an intermediate portion of an air passage such that a part of the flowing air shunts from the main flow at the position where the regulator plate is located so as to form a by-pass flow which merges again with the main flow at a downstream position Various types of heat-radiating fins also have been proposed. For instance, Japanese Utility Model Unexamined Publication No. 58-159795 discloses an arrangement in which each of a plurality of heat-radiating fins is provided with a slit which enables cooling air to flow perpendicularly with respect to the direction of the main flow of the cooling air. Japanese Utility Model Unexamined Publication No. 55-113353 discloses an arrangement in which a cylindrical stud is extended from a semiconductor device, and heat radiating fins are secured to the cylindrical stud perpendicularly thereto, with each heat radiating fin having a disk-like form of a diameter substantially the same as the length of the container of the semiconductor device and being cut along the longitudinal side of the container A cooling fluid is made to flow along the heat radiating fins and notches are formed in the fins along the flow of the cooling fluid In these known heat-radiating fin arrangement, no means has been provided for positively controlling the flow velocity distribution of the cooling fluid along the heat-radiation fins.

In a typical conventional cooling system for cooling a plurality of heat sources such as semiconductor devices arranged in series in a plurality of stages, a cooling fluid is made to flow unidirectionally from one to the other ends of the series arrangement of the heat sources In such a case, the cooling fluid temperature is gradually raised as the fluid is progressively heated so that the cooling effect is decreased towards the downstream end. resulting in a temperature distribution such that downstream heat sources exhibit higher temperatures than the upstream heat sources, as will be seen from FIG. 4. The known cooling systems mentioned previously are intended to divide the flow of a cooling fluid into a main flow component and a by-pass flow component and the by-pass flow component is merged into the main flow at a predetermined downstream portion of the cooling fluid path so as to control the temperature rising at the portion of the series arrangement of the heat sources downstream from the position where the by-pass flow component merges in the main flow component.

These known cooling systems provide an appreciable cooling effect in the region near the position where the by-pass flow component merges in the main flow component by virtue of the mixing effect caused by the mixing of flow components so that the temperature of the heat source in this region is effectively cooled to reduce its temperature as shown in FIG. 4. However, the aforementioned mixing effect terminates quickly and a single flow without mixing is produced so that no substantial improvement is achieved in the effect of cooling at the downstream side of the mixing region. Namely, the heat transfer efficiency is reduced to allow the temperatures of the downstream heat sources to rise, with the result that the performance of the heat sources such as semiconductor chips is impaired at the downstream side of the series of heat sources Known heat-radiating fins, e.g., the fins disclosed in Japanese Utility Model Unexamined Publication No. 58-159795, have slits formed in the fins so as to allow cooling air to flow in the flow direction of the main flow component of the cooling air. The slits produce a so-called leading edge effect to improve the heat transfer efficiency. This type of heat-radiating fin, however, cannot provide any appreciable increase in the heat radiating rate because the heat radiating area is decreased due to the provision of the slit In order to make an efficient use of the heat radiating fins, it is necessary that the fin has a thickness which is large enough to avoid any drastic redution in the cooling efficiency. In addition, a greater fin height requires a greater plate thickness. The provision of a slit in such a thick fin undesirably increases the area where separation of the cooling fluid takes place at the leading end of the fin. This in turn causes the tremendous increase in the flow resistance, thereby failing to supply the cooling fluid at the desired level Referring now to the heat-radiating fins of the type disclosed in Japanese Patent Unexamined Publication No. 55-113353, mixing of flow components of the cooling fluid is less liable to occur because the cooling fluid flows between adjacent heat radiation fins. In consequence, the temperature difference between the cooling fluid and the heat sources is decreased towards the downstream end, thus failing to provide the required cooling effect on the downstream heat sources.

Heat radiation fins are usually made from metals having high levels of heat conductivity such as Cu. Al and so forth. The heat conductivity, however, has a definite value. Therefore, the heat radiation effect varies along the height of the fin. Namely, a large heat radiation efficiency is obtained at the base portion of the fin where the temperature difference between the fin and the cooling fluid is large but only a small heat radiation efficiency is obtainable at the free end portion of the fin where the above-mentioned temperature difference is small.

SUMMARY OF THE INVENTION

Accordingly, it is a first object of the present invention to provide a cooling system for cooling electronic devices in which the flow of a cooling fluid is divided into a main flow component and an auxiliary flow component, the auxiliary flow component being suitably merged in the main flow component to produce a mixing effect, so as to enhance the cooling effect thereby making uniform the temperature distribution over the entire region of heat-generating portion, including the electronic devices.

It is a second object of the present invention to provide a cooling system for cooling electronic devices, wherein heat radiating fins are provided with projections in the direction of flow of the cooling fluid so as to reduce the flow resistance while increasing the flow velocity distribution at the base end portions of the heat radiation fins to thereby improve the heat transfer performance, as well as heat radiation fins for use in such a cooling system.

It is a third object of the present invention to provide a cooling system for cooling electronic devices in which the flow of a cooling fluid is divided into a main flow component and an auxiliary flow component, the auxiliary flow component being suitably merged in the main flow component to produce a collision jetting effect in addition to the mixing effect so as to enhance the cooling effect thereby making uniform the temperature distribution over the entire region of heat-generating portion including the electronic devices.

It is a fourth object of the present invention to provide a cooling system for cooling electronic devices which has means for reducing the flow resistance encountered with the cooling fluid flowing in contact with the heat radiation fins.

In order to achieve the first object, the present invention provides a cooling system for cooling an electronic device by allowing a cooling fluid to flow in contact with heat generating components of the electronic device arranged in series along the major flow of the cooling fluid, the cooling system comprising a cooling fluid flow passage in which the heat-generating components are disposed, the flow passage having, at the upstream end of the upstream end heat-generating component, a cross-sectional area greater than that of the heat-generating component when taken in a plane perpendicular to the direction of the major flow of the cooling fluid, the cross-sectional area of the flow passage progressively decreasing towards the downstream end, whereby the flow passage is composed of a main passage through which a main flow component of the cooling fluid directly flows into the series of heat-generating components and an auxiliary passage through which an auxiliary component of the cooling fluid flows towards each heat-generating component at an angle with respect to to the main flow component.

The cooling system of the above-mentioned type also may be arranged to comprise: heat radiation members connected to the heat-generating components; and a cooling fluid flow passage in which assemblies composed of the heat-generating components and the heat radiation members are disposed, the flow passage having, at the upstream end of the upstream end assembly, a cross-sectional area greater than that of the assembly when taken in a plane perpendicular to the direction of the major flow of the cooling fluid, the cross-sectional area of the flow passage being progressively decreasing towards the downstream end, whereby the flow passage is composed of a main passage through which a main flow component of the cooling fluid directly flows into the series of assemblies and an auxiliary passage through which an auxiliary component of the cooling fluid flows towards each assembly at an angle with respect to to the main flow component.

To achieve the second object, the heat radiation member may include at least one heat radiation fin provided on each of the heat-generating components, and at least one surface of each of the heat radiation fin may be provided with at least one inclined projection which is inclined so as to guide the cooling fluid towards the heat-generating component.

The flow passage may be formed by a duct having a top wall and lateral side walls which are connected to tapered walls which progressively approach the heat-generating component, whereby the cross-sectional area of the flow passage taken in a plane perpendicular to the major flow of the cooling fluid is progressively decreases towards the downstream end.

To achieve the third object, the present invention provides a cooling system for cooling an electronic device by allowing a cooling fluid to flow in contact with heat generating components of the electronic device arranged in series along the major flow of the cooling fluid, the cooling system comprising: heat radiation members connected to the heat-generating components; and a cooling fluid flow passage in which assemblies composed of the heat-generating components and the heat radiation members are disposed, the flow passage having, at the upstream end of the upstream end assembly, a cross-sectional area greater than that of the assembly when taken in a plane perpendicular to the direction of the major flow of the cooling fluid, the cross-sectional area of the flow passage progressively decreasing towards the downstream end, whereby the flow passage is composed of a main passage through which a main flow component of the cooling fluid directly flows into the series of assemblies and an auxiliary passage through which an auxiliary component of the cooling fluid flows towards each assembly at an angle with respect to the main flow component, the cooling system further comprising at least one guide vane disposed in the auxiliary passage, the angle of the guide vane being adjustable with respect to the direction of flow of the cooling fluid flowing into contact with the guide vane.

The invention also provides an electronic device comprising means for supplying a cooling fluid and a casing for receiving the cooling fluid and accommodating heat-generating components and heat radiation members attached to the heat-generating components, characterized by having one of the cooling systems as set forth above.

To achieve the fourth object, the present invention provides a heat radiation fin connected to a heat-generating component of an electronic device so as to radiate heat from the heat-generating component, thereby cooling the heat-generating component, comprising a fin panel and at least one projection provided on at least on one surface of the fin panel locally or in a discontinuous row, the projection having a longitudinal axis extending substantially in the direction of flow of the cooling fluid and inclined such that the distance between the heat-generating component and the upstream end of the projection is greater than the distance between the heat-generating component and the downstream end of the projection.

The projection may have a polygonal cross-section having at least three sides when taken at a plane substantially parallel to the fin panel. The projection also may have a semi-circular cross-section when taken at a plane substantially parallel to the fin panel, and a stream-lined sectional shape when taken along a plane parallel to the direction of flow of the cooling fluid.

The heat radiation fin may have means for reducing flow resistance to the flow of the cooling fluid at the base end region of the fin panel adjacent to the heat-generating component, as compared with other regions of the fin panel. The means for reducing the flow resistance may include a reduced number or height of the projections and greater spacing of the projections as compared with the other regions.

BRIEF DESCRIPTION OF THE DRAWINGS

FIG. 16 is a fragmentary perspective view of a different embodiment of the present invention;

FIG. 18 is a sectional view of taken along the line XVIII—XVIII of FIG. 16, showing the cross-sectional shape of the projection formed on the fins used in the embodiment shown in FIG. 16;

FIGS. 19 and 20 are illustrations of other examples of the cross-sectional shape of the projection;

FIG. 21 is an illustration of operation of the present invention;

DESCRIPTION OF THE PREFERRED EMBODIMENTS

Preferred embodiments of the invention will be described with reference to the accompanying drawings.

First embodiments

Figure 1:
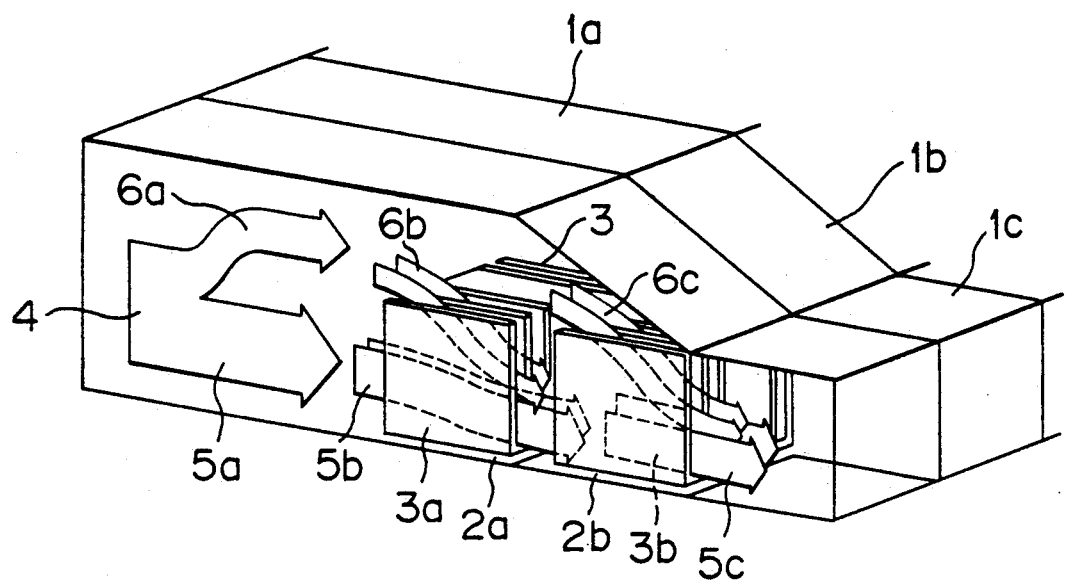
FIG. 1 is a perspective view of a first embodiment of the present invention.

FIG. 1 illustrates a first embodiment of the cooling system in accordance with the present invention. The cooling system has cooling ducts (cooling passages) 1a, 1b and 1c connected in series to provide a passage for a cooling fluid such as air.

More specifically, the cooling duct la is capable of introducing cooling air supplied by, for example, a blower to heat sources 2a, 2b such as LSIs. The duct 1a has a height greater than the height of fins 3a provided on the upstream heat source 2a. The heat radiation fins 3 are tabular fins arranged in parallel with one another and extending in the direction of flow of the cooling air. The duct 1b has a tapered top wall which extends from the downstream end of the duct 1a substantially above the downstream end of the heat source 2a to the downstream end of fins 3b provided on the downstream heat source 2b. The duct 1c is connected to the downstream end of the duct 1b and leads to a cooling air discharge opening. In this embodiment, two heat sources 2a and 2b carrying respective fins 3a and 3b are arranged in series in the direction of flow of the cooling air, and the cooling air passage is formed by the series connection of the ducts 1a, 1b and 1c which are constructed such that the cross-sectional area of the air passage formed by these ducts, i.e., the area of plane perpendicular to the direction of flow of the cooling air, progressively decreases towards the downstream end of the cooling air passage.

The effect produced by this cooling system will be described. Referring to the behavior of the cooling air, the air 4 (incoming air) coming from the blower into the duct 1a is divided at a position upstream of the heat source 2a and fins 3a into two components: namely, a straight flow component 5a which is the main component flowing straight into a main passage defined by the fins 3 and the heat source 2a, and a vertical flow component 6a which is an auxiliary flow component flowing into the space above the fins 3a, i.e., the space other than the main passage. The straight flow component 5a flows through channels between the fins 3a substantially in parallel with the heat source 2a as indicated by an arrow 5b. On the other hand, the vertical flow component 6a first flows along upper portions of the fins 3a but a portion of this component 6a is deflected downward by the top wall of the duct 1b which is tapered downward so as to form a flow component 6b which is directed from the upper ends of the fins 3a towards the heat source 2a. Thus, a composite air flow component composed of the straight flow component 5b and the downwardly deflected vertical flow component 6b is introduced into each channels between adjacent fins 3a. At the region immediately upstream from the downstream heat source 2b and the fins 3b, the mixture of the flow components 5b and 6b formed in the upstream stage, now forming a straight flow component 5c, is introduced together with a portion 6c of the vertical flow component which was separated in the upstream stage, and these components flow towards the heat source 2b through the upper ends of the fins 3b. Thus, a mixture of the straight flow component 5c and the vertical flow component 6c is formed in the downstream stage. The flow rate of the cooling air flowing through the main passage on the downstream heat source 2b is greater than the flow rate of the cooling air in the main flow passage on the upstream heat source 2a by an amount corresponding to the flow rate of the vertical flow component 6c. All the portions of the cooling air supplied by the blower are collected in the duct 1c so as to be discharged therefrom.

In this embodiment, cooling air is supplied to each heat source 2a, 2b and fins 3a, 3b in the form of a mixture of a straight flow component (main flow component) and the vertical flow component (auxiliary component), by the above-described arrangement of ducts. In consequence, the following effect is produced in regard to transfer of heat.

Figure 2:
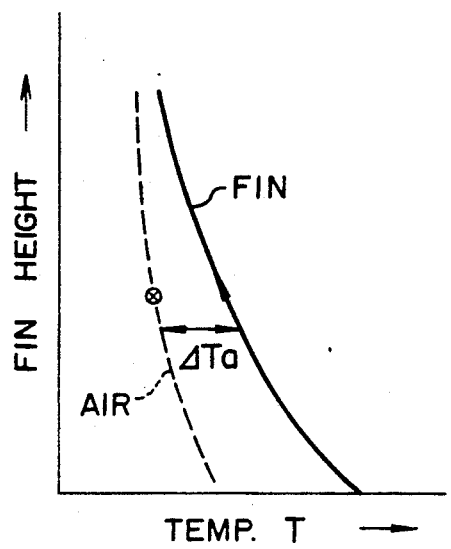
FIG. 2 is a graph illustrative of temperature distribution characteristics as obtained by a known cooling system.
Figure 3:
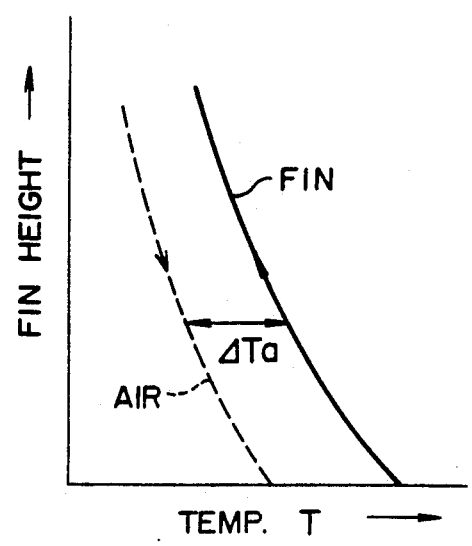
FIG. 3 is a graph illustrative of temperature distribution characteristics as obtained by a cooling system in accordance with the present invention.
Figure 4:
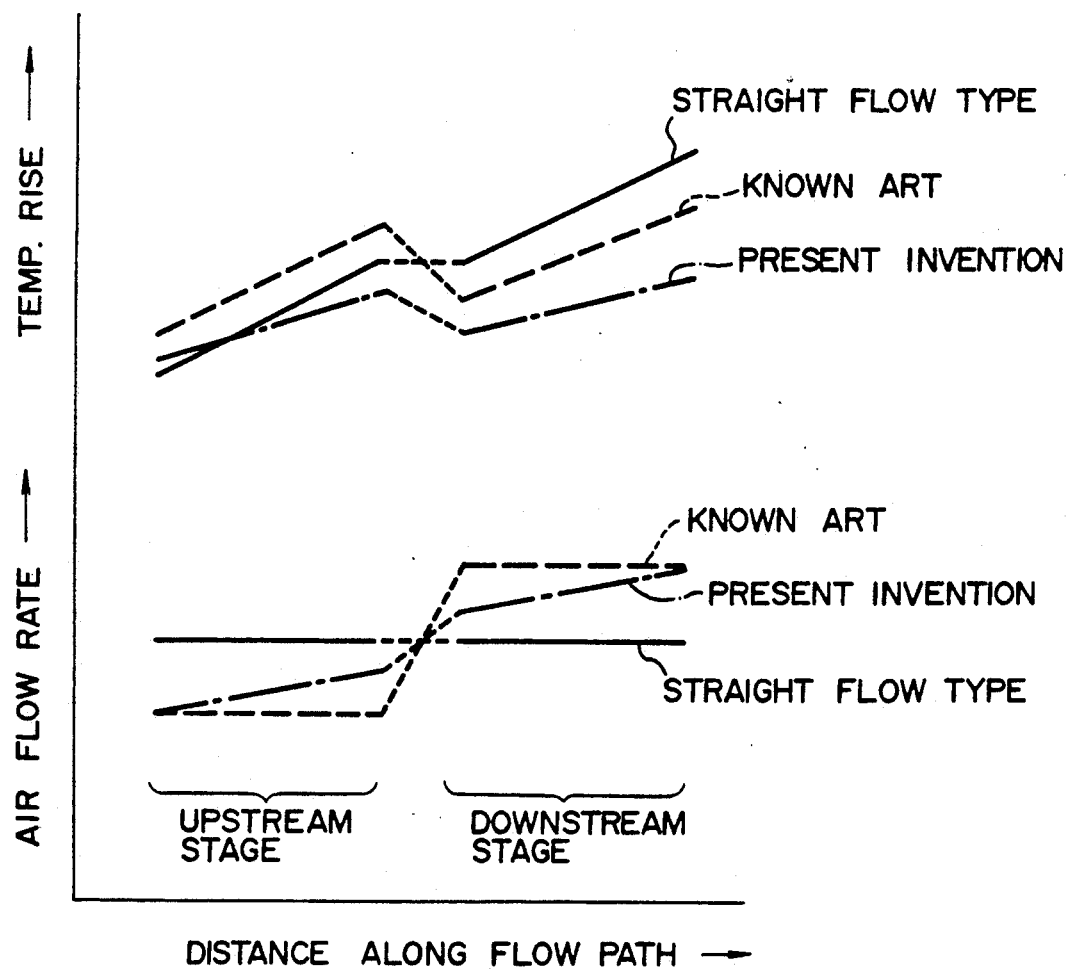
FIG. 4 is a graph showing the cooling characteristics of the cooling system of the present invention in comparison with those of other cooling systems.

If the flow of the cooling air has a straight flow component alone, the direction of flow of the cooling air is perpendicular to the direction of transmission of heat through the heat radiation fin, so that a temperature profile as shown in FIG. 2 is obtained. Namely, the temperature difference $\Delta Ta$ between the fin and the cooling air is decreased towards the upper end of the fin and the mean temperature difference $\Delta Ta$ also is small. The mean temperature difference $\Delta Ta$ is a factor which directly affects the heat radiation and, hence, is preferably large. On the other hand, when the cooling air is directed to flow into the channels between the heat radiation fins vertically downwardly through the upper ends of the fins, the cooling air flows in the direction counter to the direction of transmission of heat in the fins, so that the mean temperature difference $\Delta Ta$ is increased, as will be seen from FIG. 3. In consequence, the mixture of the straight flow component and vertical flow component as realized in the described embodiment offers mainly the following three effects: namely, (a) an increase in the heat radiation rate due to introduction of the vertical flow component, (b) improvement in the heat transfer due to collison effect produced by the introduction of the vertical component, and (c) improvement in the heat transfer due to turbulency of the cooling air as a result of mixing of the straight and vertical components. These multiple effects offer a remarkable improvement in the heat radiation from the heat radiation fins. Referring to FIG. 4, the cooling characteristic as obtained in the described embodiment is shown by one-dot-and-dash line. It will be seen that the heat transfer promotion effect is produced both in the upstream and downstream stages by the introduction of the vertical a flow components, so that the temperature distribution is made uniform while the rise of temperature of the heat sources in both stages is effectively suppressed.

In the known cooling systems, the by-pass flow component is formed by using a partition wall. The presently described embodiment does not necessitate such a partition wall and, therefore, reduces the number of parts to be employed. In addition, pressure loss is reduced because repeated contraction and expansion of flow of air, which take place in the known arrangement when the by-pass air flows through apertures formed in the partition wall, do not take place in the described embodiment.

Second Embodiment

Figure 5:
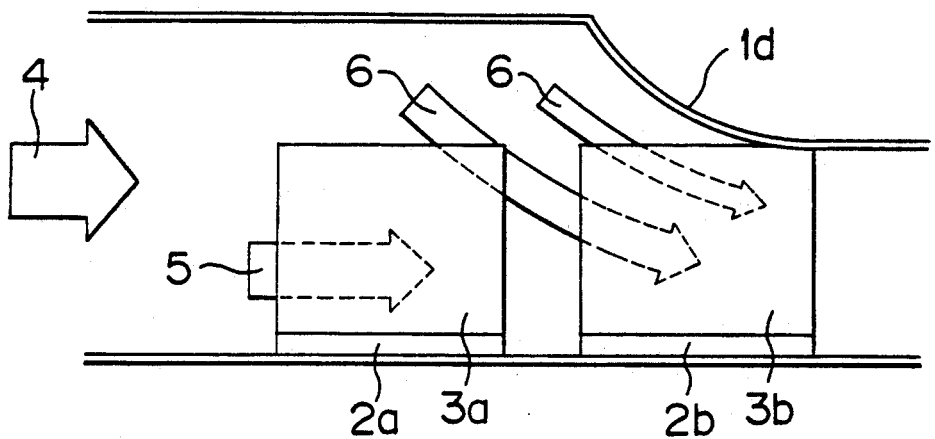
FIG. 5 is a longitudinal sectional view of another embodiment of the present invention.
Figure 6:
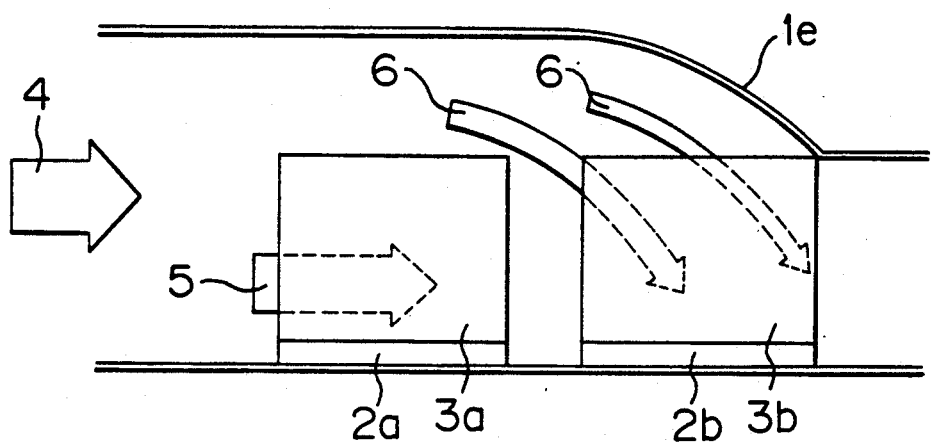
FIG. 6 is a longitudinal sectional view of a modification of the embodiment shown in FIG. 5.

FIGS. 5 and 6 show embodiments similar to the first embodiment but employing different configurations of the downwardly tapered top wall of the duct 1b. Referring first to FIG. 5, a top wall of the duct 1d is projected downward. This arrangement enables the vertical component 6 of the air to be very smoothly introduced into the channels between the fins so that the flow resistance through the cooling system is remarkably reduced to offer a corresponding reduction in the power for driving the blower.

In FIG. 6, the top wall of a duct 1e is projected upward. This arrangement causes the vertical flow component 6 to be mixed with the straight flow component at a large angle so as to enhance the effect of collision of air to the heat source and the effect of mixing of both flow components, whereby the heat transfer is promoted remarkably. This cooling system also can be applied to the cases where a plurality of heat sources are arranged in a plurality of rows.

Embodiment 3

Figure 7:
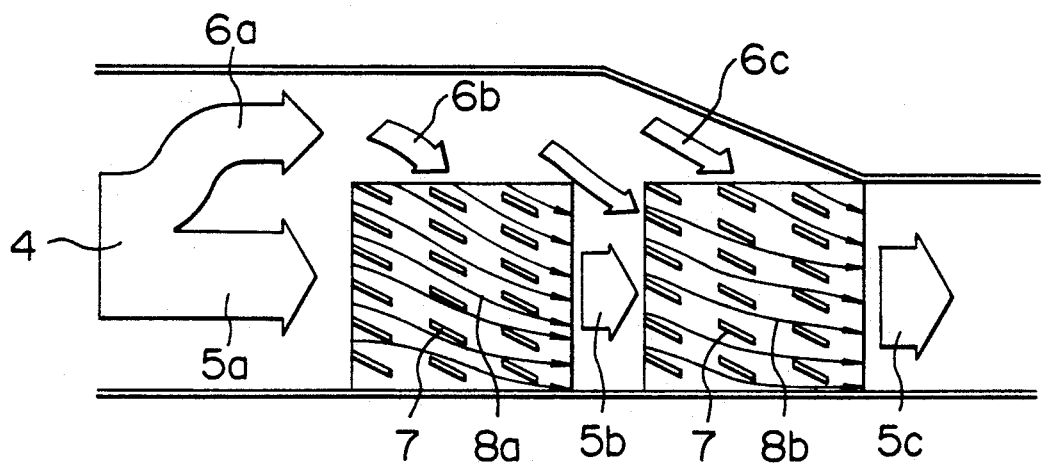
FIG. 7 is a longitudinal sectional view of a further embodiment of the present invention.
Figure 8:
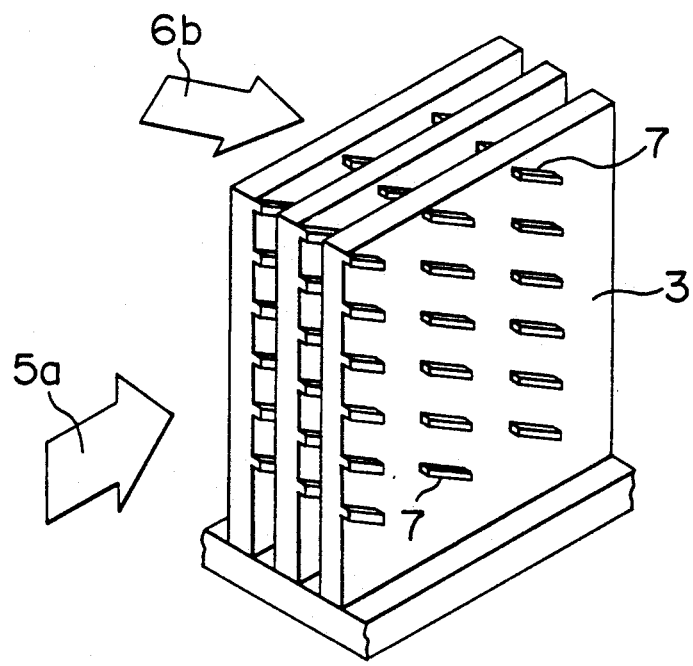
FIG. 8 is a perspective view of the embodiment shown in FIG. 7, illustrative of the construction of fins.

FIGS. 7 and 8 show embodiments which have specific forms of heat radiation fins. Referring to FIG. 7, small inclined projections 7 are formed on the surfaces of each heat radiation fin 3 in a plurality of discontinuous rows. Each small inclined projection 7 is inclined such that its downstream end approaches the heat source 2. According to this arrangement, the composite flow components 8a, 8b formed by the straight flow component 5 and the vertical flow component 6 in the respective stages are guided by the projections 7 so as to flow towards the heat source 2 and so as to be mixed at the downstream side of the projection 7. In consequence, both flow components are mixed very smoothly and promotion of heat transfer caused by the mixing of the flow components is obtained uniformly over the entire height of each heat radiation fin down to the region near the base end of the fin. Furthermore, the total heat transfer area is increased by the provision of the small inclined projections 7 to enhance the heat radiation, which, in combination with the above described effect of the projections, maximizes the heat radiation promotion effect.

Embodiment 5

Figure 9:
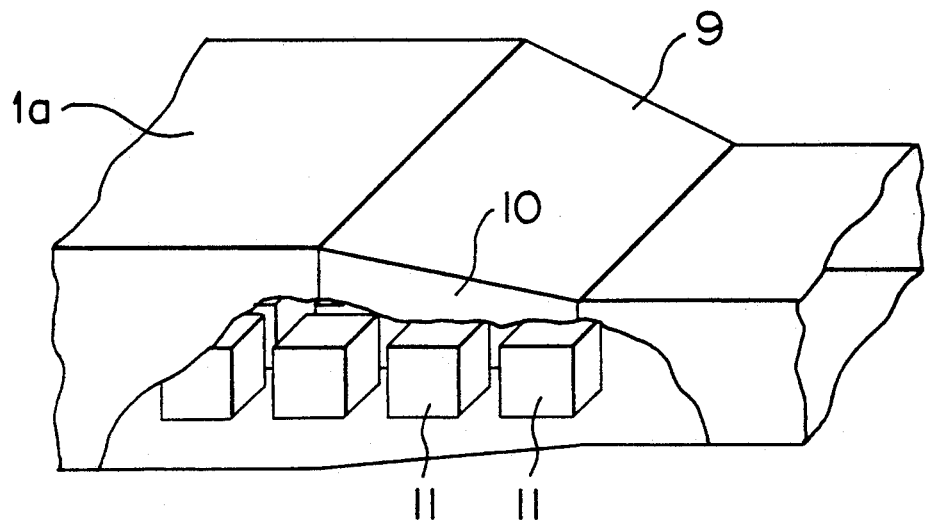
FIG. 9 is a perspective view of a different embodiment of the present invention.
Figure 10:
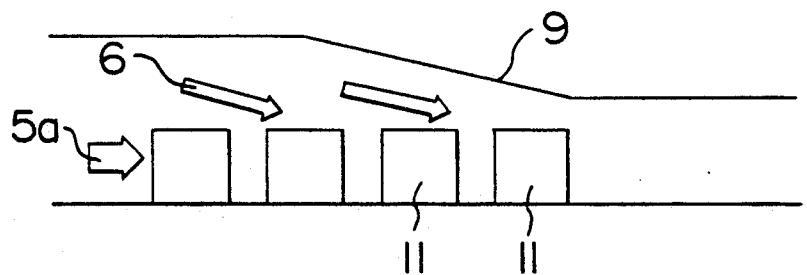
FIG. 10 is a longitudinal sectional view of the embodiment shown in FIG. 9.
Figure 11:
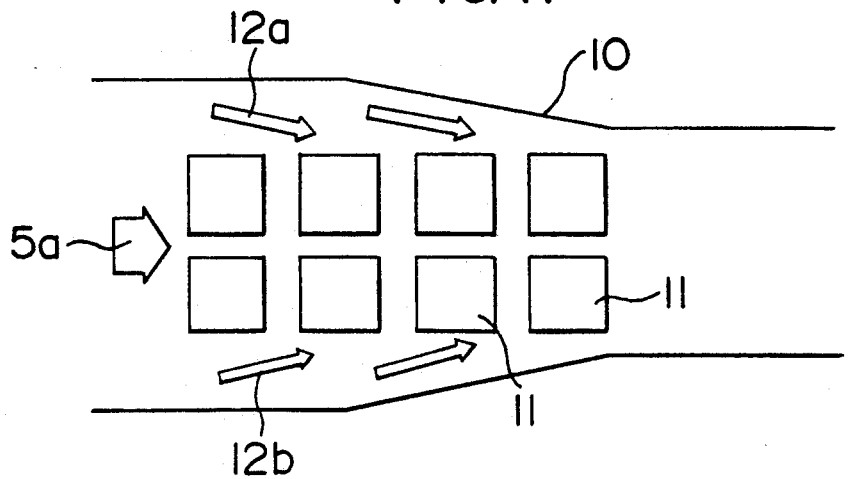
FIG. 11 is a cross-sectional view of the embodiment shown in FIG. 10.

FIGS. 9 to 11 show an embodiment in which a lateral flow component is introduced in addition to the vertical flow component. FIG. 10 is a longitudinal sectional view of the arrangement shown in FIG. 9, while FIG. 11 is a sectional plan view of the arrangement shown in FIG. 9. In this embodiment, the intermediate duct has a tapered top wall 9 and tapered both side walls 10. In consequence, a composite flow of cooling air is composed of the straight flow component 5, vertical flow component 6 and both lateral flow components 21a, 21b. According to this arrangement, cooling air which is still cold is continuously supplied not only from the upper side but also from both lateral sides, so that the heat transfer promotion effect produced by the mixture flow is remarkably enhanced. This embodiment performs effective cooling even on heat sources which does not have cooling fins.

Embodiment 6

Figure 12:
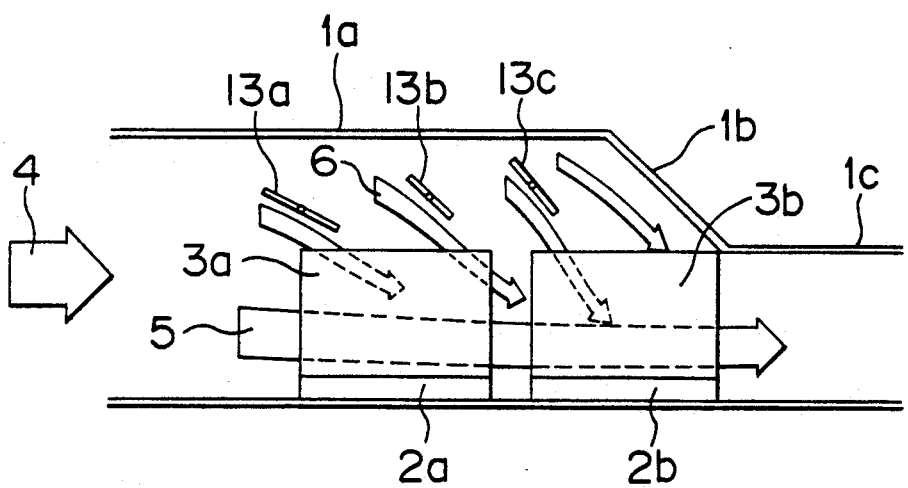
FIG. 12 is a longitudinal sectional view of a different embodiment of the present invention.

FIG. 12 is a vertical sectional view of a different embodiment which is characterized by provision of guide vanes 13a, 13b and 13c in the auxiliary passage above the fins 3a, 3b. These guide vanes 13a, 13b and 13c are intended for forcibly directing the vertical component 6 of the cooling air to a specific direction. In consequence, the vertical flow component is forcibly directed towards the heat source without fail. The inclination angle of the guide vanes is adjustable so as to enable the distribution of the vertical component to be varied. This in turn enables the mixture flow to be optimized for a variety of size and heat generating rate of the heat source to be cooled. In consequence, the remarkable cooling effect offered by the first embodiment is further enhanced.

Figure 13:
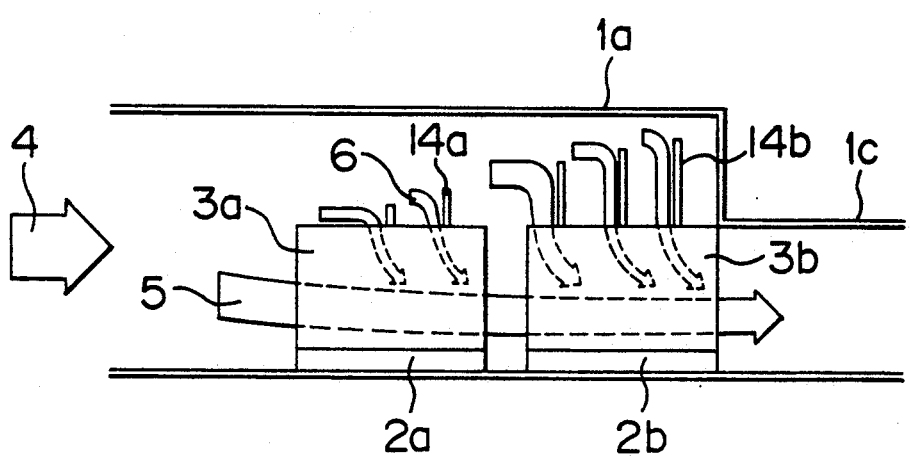
FIG. 13 is a longitudinal sectional view of the embodiment shown in FIG. 12.

FIG. 13 illustrates a modification of the embodiment shown in FIG. 12, in which guide plates 14a, 14b and 14v are fixed to the upper ends of the fins 3a, 3b substantially perpendicularly to the fins 3a, 3b. The height of the guide plates 14a, 14b progressively decrease towards the downstream end. According to this arrangement, the distribution of the vertical flow component is made uniform over the heat radiation fins of the upstream and downstream stages, and the vertical component is directed substantially perpendicularly to the surface of the heat source.

In consequence, this embodiment produces a significant collision effect caused by the collision of the vertical flow component with the heat source. This arrangement, therefore, enhances the cooling effect of the first embodiment when combined with the first embodiment.

Figure 14:
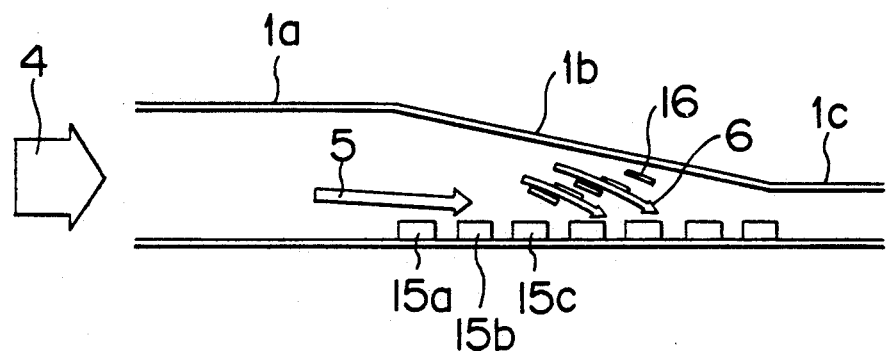
FIG. 14 is a longitudinal sectional view of another modification of the embodiment shown in FIG. 12.

FIG. 14 shows another modification of the embodiment shown in FIG. 12, suitable for cooling a series of heat sources 15a, 15b and 15c which do not have heat radiation fins. In this arrangement, guide vanes 16 serve to fully direct the vertical flow component towards the straight flow component 5 in the heat sources. When there is no heat radiation fin, the resistance to heat transfer from the heat source and the cooling air is remarkably reduced mainly by the collision effect produced by the vertical component and the turbulency formed as a result of mixing of the straight and vertical components.

Embodiment 7

Figure 15:
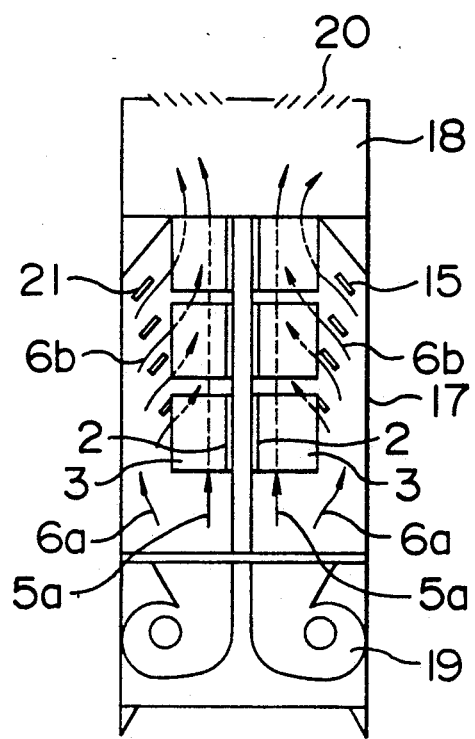
FIG. 15 is a longitudinal sectional view of the whole of a cooling apparatus to which the present invention is applied.

FIG. 15 is a longitudinal sectional view of an embodiment suitable for use in cooling an air-cooled computer. This cooling system has a casing 17, an air discharge chamber 18, a blower 19 and a louver 20 which serves as an air outlet. More specifically, this embodiment has a dual type cooling system: namely, a pair of cooling systems in each of which are arranged heat sources 2 such as LSI chips and heat radiation fins 3. Blowers 19 are operated during operation of the computer so that cooling air is introduced into each cooling system so as to be delivered into a straight flow component 5a flowing through the main flow passage and the vertical component 6a flowing through the auxiliary passage. High heat transfer promotion effect produced by the mixing of the flow components 5a and 6a is obtained in each channel between the adjacent heat radiation fins so that a very large cooling effect is obtained. Furthermore, the LSI chips are uniformly cooled by uniform distribution of the vertical flow component. This enables the devices such as the LSI chips to be mounted densely without any risk of excessive temperature rise, thus facilitating design of high-speed air-cooled computer.

Embodiment 8

FIG. 16 shows an embodiment in which heat radiation fins of the present invention are attached to an electronic device such as a computer. Numeral 21 denotes a heat source such as a multi-chip module, 22 denotes a fin base and 23 denote fin panels. Each fin panel has discontinuous rows of elongated inclined projections 24, 25. The projections 25, which are shown by broken lines, are provided on the reverse side of the fin panel 23. The inclined projections 24, 25 have a substantially rectangular cross-sectional shape as shown in FIG. 18, although a triangular cross-section or a semi-circular cross-section as shown in FIGS. 19 and 20, as well as a composite cross-sectional form, may be used. The characteristic feature of this embodiment resides in that the longitudinal axes of the inclined projections 24, 25 are inclined such that the air outlet end of each projection approaches the fin base 22. The fin panel 23 and the inclined projections 24, 25 in combination provide a fin element and a plurality of such fin elements are bonded to the fin base 22 at a predetermined pitch so as to form a heat radiation fin assembly.

Figure 17:
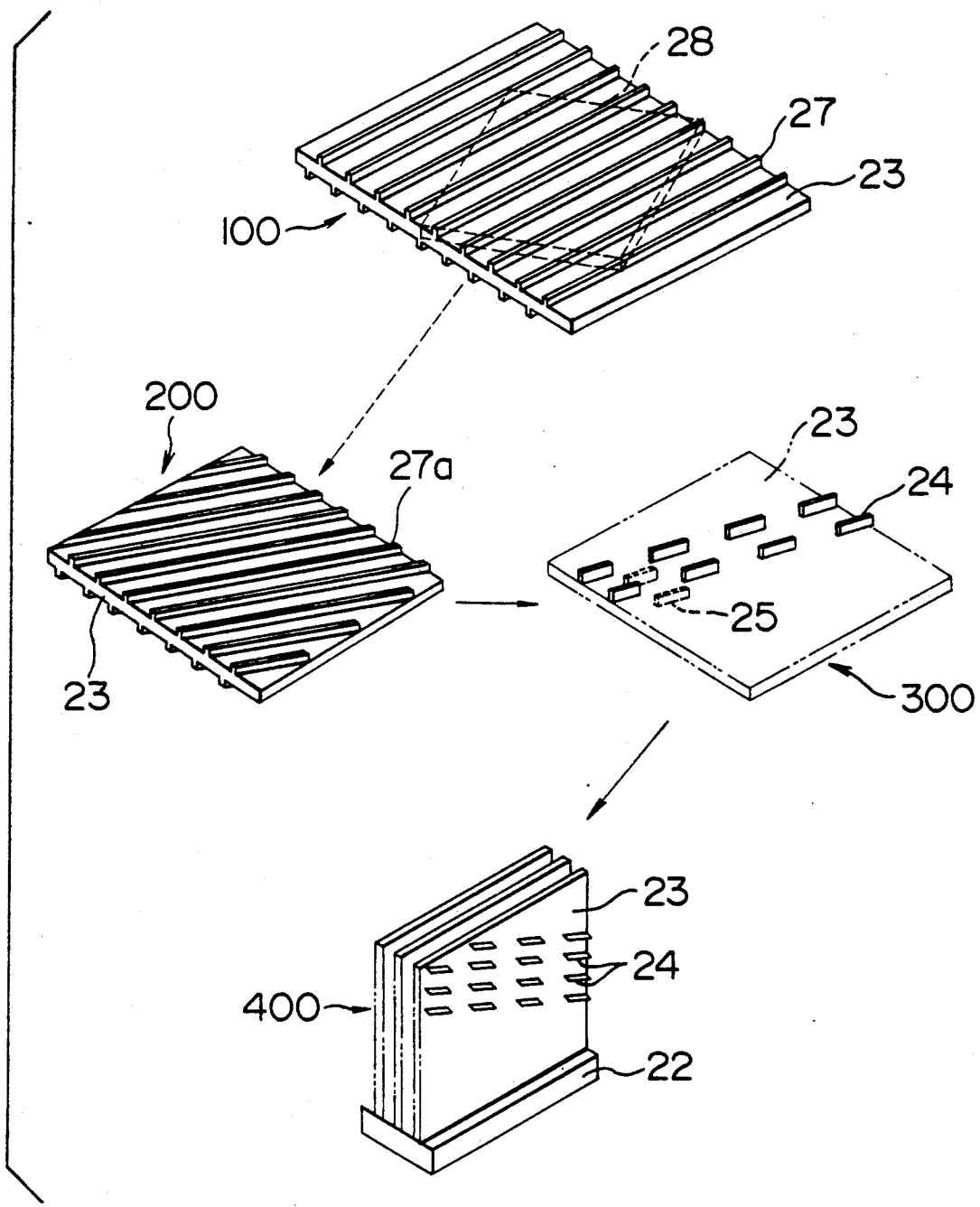
FIG. 17 is an illustration of a process for manufacturing the embodiment shown in FIG. 16.

FIG. 17 shows an example of a process for producing the embodiment shown in FIG. 16. In a first step denoted by numeral 100, a fin panel blank having continuous inclined projections is formed by extrusion. In a second step denoted by numeral 200, the fin panel blank is cut along the broken lines so that a fin panel blank with continuous parallel projections is obtained. In a third step denoted by numeral 300, projections on the fin panel blank are partially cut so as to form a fin panel having discontinuous projection rows. In a fourth step denoted by numeral 400, fin panels formed through first to fourth steps are arranged at a predetermined interval and bonded to the fin base 22. It is thus possible to continuously fabricate the fin assembly by the process having the first to fourth steps described above.

The operation of this embodiment will be described with reference to FIGS. 21 to 23.

FIG. 21 shows the behavior of the cooling air used as the cooling fluid. Cooling air 26 flowing into the group of fins 23 is guided by the inclined projections 24 so as to be deflected towards the fin base 22, i.e., towards the heat source 21. In consequence, the cooling air flows along a path as denoted by 32. In consequence, a flow velocity distribution is formed such that the flow velocity is higher in the region near the fin base 22 of each heat radiation fin than in the region near the free end of the fin, and this distribution is enhanced in the downstream region than in the upstream region as denoted by 34. When the flow of the cooling air reaches the temperature (velocity) boundary layer 33 around the inclined projection 24, a horizontal flow component is progressively generated because of the presence of the fin base 22 at the lower end, though the flow of the cooling air 32 is generally guided downward. In consequence, the cooling air is directed in a direction which is closer to the horizontal direction than the direction of inclination of the inclined projection 24. Therefore, the downstream end of the temperature (velocity) boundary layer 33 formed around the inclined projection 24 is deflected slightly upward from the entrance or upstream end of the inclined projection immediately downstream therefrom. Thus, the entrance of the downstream inclined projection is not affected by the boundary layer 33 formed by the inclined projection immediately upstream therefrom. In addition, mixing of the flow of air is enhanced by the mutual interference between the cold downward flow component and the horizontal component of the cooling air.

The above-described behavior of the cooling air produces the following effect. The promotion of mixing of the flow component and the above-described upward deflection of the boundary layer remarkably improves the efficiency of heat transfer from the inclined projections 24 and the fin panel 23 to the cooling air. In particular, a remarkable improvement is achieved in the heat transfer performance of the heat radiation fin because each inclined projection 24 can effectively function to transfer heat without being disturbed by the boundary layer formed by another inclined projection which is immediately upstream thereof. In addition, the following advantages are offered by the flow velocity distribution 34.

Figure 22:
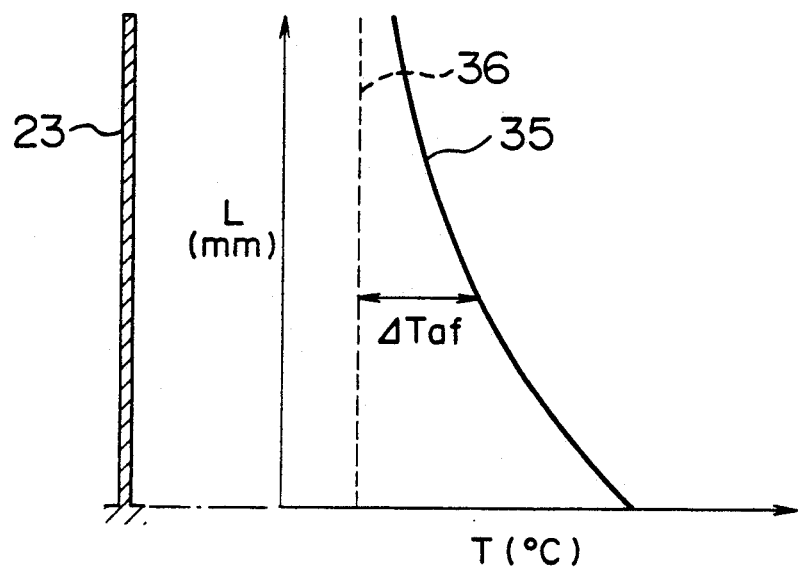
FIG. 22 is an illustration of the effect of the present invention.
Figure 23:
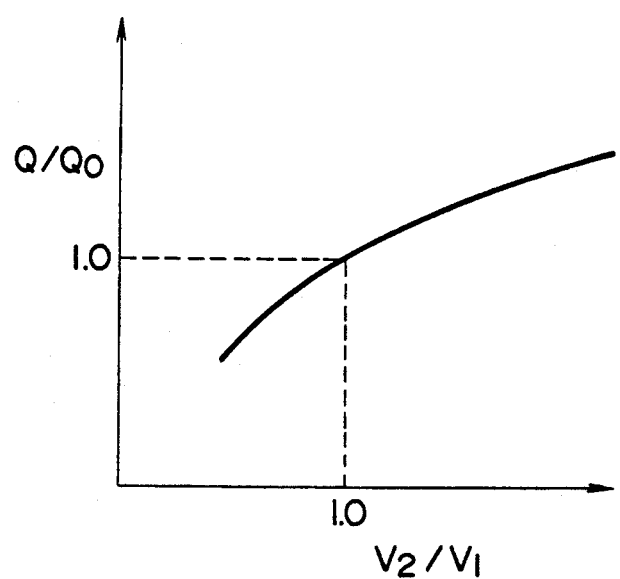
FIG. 23 is another illustration of the effect of the present invention.

FIG. 22 shows distributions of the fin temperatue 35 and the air temperature 36 along the heightwise length L of the fin. It will be seen that the temperature difference $\Delta T_{af}$ between the fin and the cooling air increases towards the fin base 22. This means that the rate of heat radiation can be increased by promoting the mixture of flow components such that the flow velocity is increased in the region near the fin base 22. FIG. 23 shows the result of a study conducted to confirm the effect of such a control of the flow velocity. In this Figure, $V_1$ and $V_2$ represent, respectively, the mean air flow velocities at the upper and lower half parts of the fin. The axis of the abscissa represents the ratio $Q/Q_0$ of the heat radiation rate Q to the heat radiation rate $Q_0$ which is obtained when the velocity ratio $V_2/V_1$ is 1, i.e., when the air flow velocity is uniform over the entire height of the fin. It will be seen that the heat radiation rate Q is increased when the flow velocity distribution is controlled such that the flow velocity is higher at the base end region of the fin than at the free end region of the fin. Namely, the heat radiation rate Q can be increased by realizing the flow velocity distribution 34 shown in FIG. 21. This embodiment produces a remarkable effect in improving the heat radiation performance by the combination of the effects described above.

Figure 24:
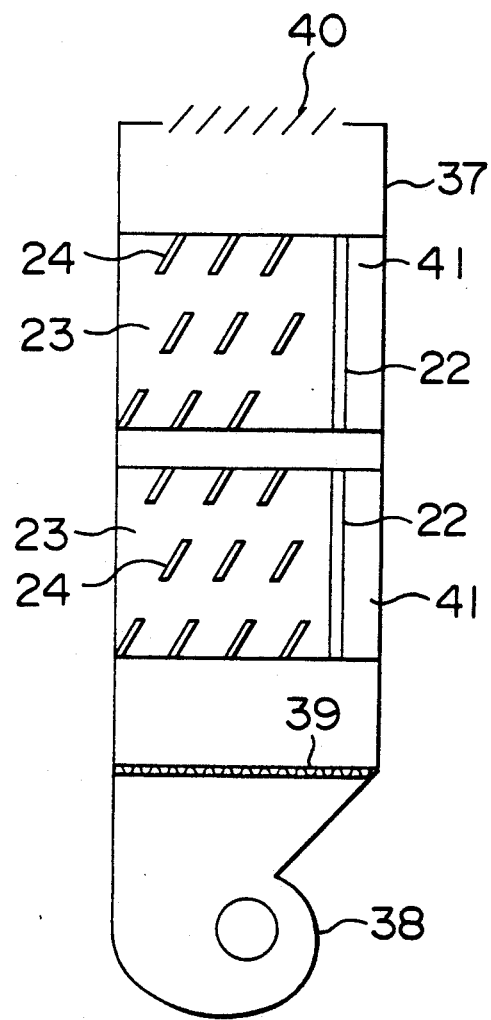
FIG. 24 is an illustration of an arrangement in which the heat radiation fins contructed in accordance with the present invention are used for cooling a computer.

FIG. 24 is an illustration of an arrangement in which heat radiation fins of the type shown in FIG. 21 are used for the purpose of a computer system which is composed of multi-chip modules 41 arranged in two stages. Numeral 38 denotes a cooling air blower, 39 denotes a flow settling member for preventing any offset of the flow of air and 40 denotes a louver serving as an air outlet. These components are encased by a casing 37. In operation, the air supplied by the blower 38 is made to flow through the flow settling member 39 so as to form a stable flow of a uniform flow velocity distribution. This flow of air is supplied to the cooling system for cooling the multi-chip modules 41. As explained before, the cooling air is deflected to approach the fin base 22 by the presence of the inclined projections 24, 25, while attaining vigorous mixing of the flow components, so that the heat radiation is enhanced to effectively cool the multi-chip modules even when each module has LSI chips mounted at a high density.

Ninth Embodiment

Figure 25:
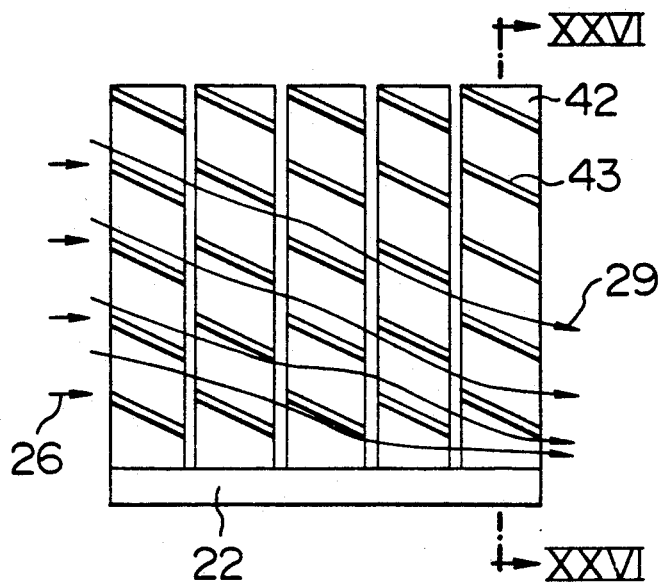
FIG. 25 is an illustration of a different embodiment of the present invention.
Figure 26:
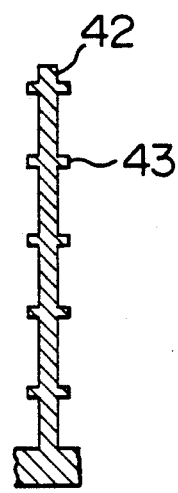
FIG. 26 is a sectional view taken along the line XXVI—XXVI of FIG. 25.

FIG. 25 shows an embodiment in which each fin panel 42 is divided into a plurality of sections which are arranged at a suitable interval in the direction of flow of the cooling fluid 26. Each section has a sectional shape as shown in FIG. 26 which is a sectional view taken along the line XXVI—XXVI of FIG. 25. This arrangement eliminates any unfavorable effect which may otherwise be caused by a thermal distortion of the fin panel 42. In addition, this arrangement makes it possible to arrange the inclined projections 43 such that each inclined projection is disposed between two adjacent inclined projections 43 of the upstream fin panel section as viewed in the direction of flow of the cooling fluid, thereby diminishing any unfavorable effect of the temperature boundary layer on the downstream inclined projection, while promoting the mixing of flow components.

Tenth Embodiment

Figure 27:
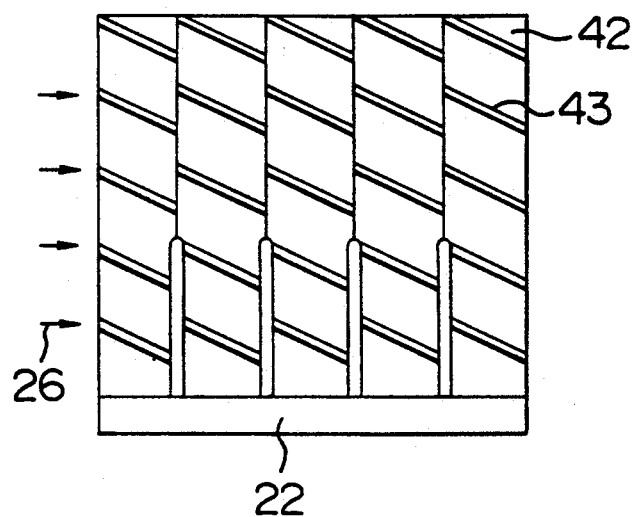
FIG. 27 is an illustration of a different embodiment of the present invention.
Figure 28:
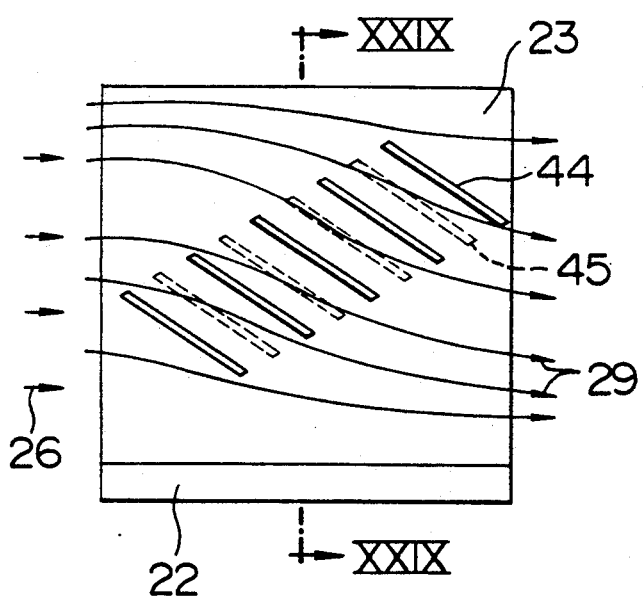
FIG. 28 is an illustration of a different embodiment of the present invention.
Figure 29:
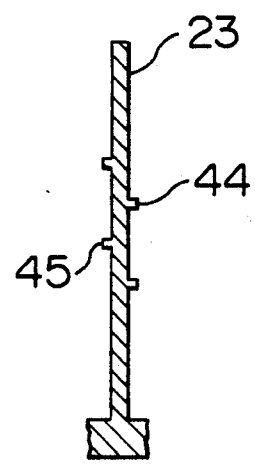
FIG. 29 is a sectional view taken along the line XXIX—XXIX of FIG. 28 showing the sectional shape of a fin.
Figure 30:
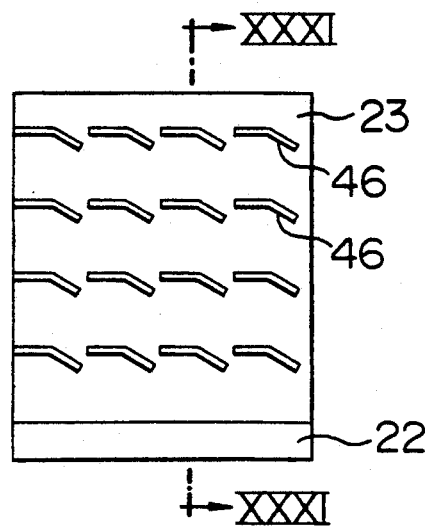
FIG. 30 is an illustration of a different embodiment.
Figure 31:
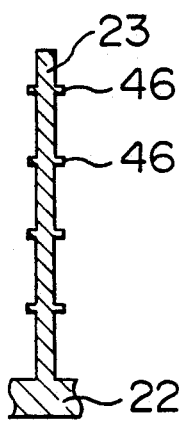
FIG. 31 is a sectional view taken along the line XXXI—XXXI of FIG. 30 showing the sectional shape of a fin.
Figure 32:
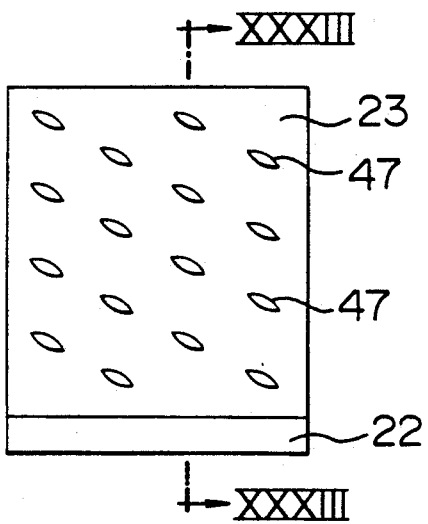
FIG. 32 is an illustration of a different embodiment of the present invention.
Figure 33:
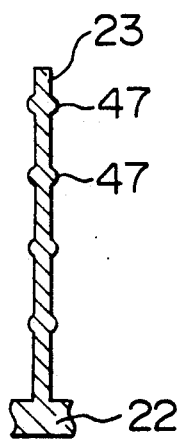
FIG. 33 is a sectional view taken along the line XXXIII—XXXIII of FIG. 32 showing the sectional shape of a fin.
Figure 34:
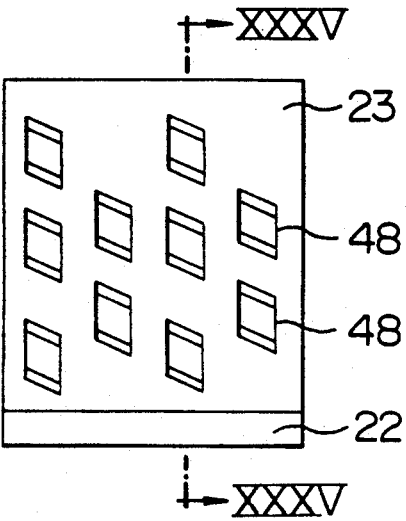
FIG. 34 is an illustration of a different embodiment of the present invention.
Figure 35:
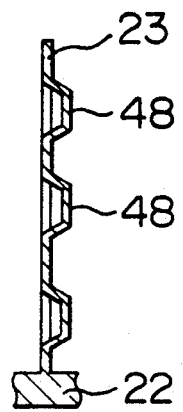
FIG. 35 is a setional view taken along the line XXXV—XXXV of FIG. 34 showing the sectional shape of a fin.

FIG. 27 shows a different embodiment which is a modification of the embodiment shown in FIG. 25. In this embodiment, the fin panel 42 is composed of a plurality of sections which are assembled to form gaps at the ends of these sections adjacent to the fin base 22. In FIG. 28, projections 44 and 45 are formed on both sides of the fin panel 42 in a staggered manner as will be seen from FIG. 29, which is a sectional view taken along the line XXIX—XXIX of FIG. 28. This embodiment produces a heat transfer promotion effect which is not so appreciable because of the reduced number of projections, although a flow velocity distribution control effect substantially equivalent to the embodiment shown in FIG. 16 is obtained. The projections can have a sectional shape in a plane parallel to the flow of the cooling fluid which is composed of a substantially horizontal upstream portion and a downwardly inclined downstream portion as denoted by 46 in FIG. 30. The cross-sectional shape of the projection taken along the line XXXI—XXXI of FIG. 30 is shown in FIG. 31. This type of projection 46 enhances the effect of mixing of flow components of the cooling fluid but the flow resistance encountered with the flow of the fluid is slightly increased. FIG. 32 shows inclined projections having a stream-lined configuration denoted by 47. The cross-sectional shape taken along the line XXXIII—XXXIII of FIG. 32 is shown in FIG. 33. The stream-lined configuration of the inclined projections appreciably reduces the flow resistance. In FIG. 34, the inclined projections, denoted by numeral 48, are formed by slitting the fin panel and raising the portions between adjacent slits into the form of a plurality of bridges. The cross-sectional shape taken along the line XXXV—XXXV of FIG. 34 is shown in FIG. 35. This type of inclined projections is advantageous in that the inclined projections can be formed in a single step, particularly when the thickness of the fin panel 23 is small.

The embodiments described with reference to FIGS. 21 to 35 offer advantages which are more or less equivalent to the advantages brought about by the embodiment shown in FIG. 16.

Embodiment 11

Figure 36:
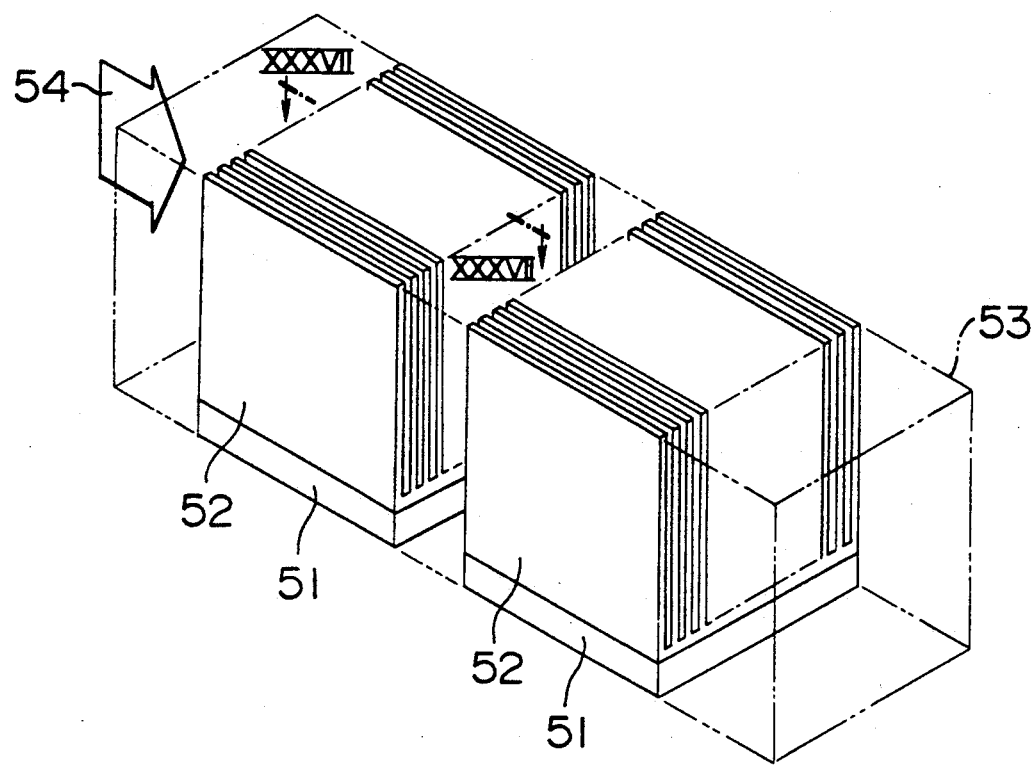
FIG. 36 is an illustration of a different embodiment of the present invention.
Figure 37:
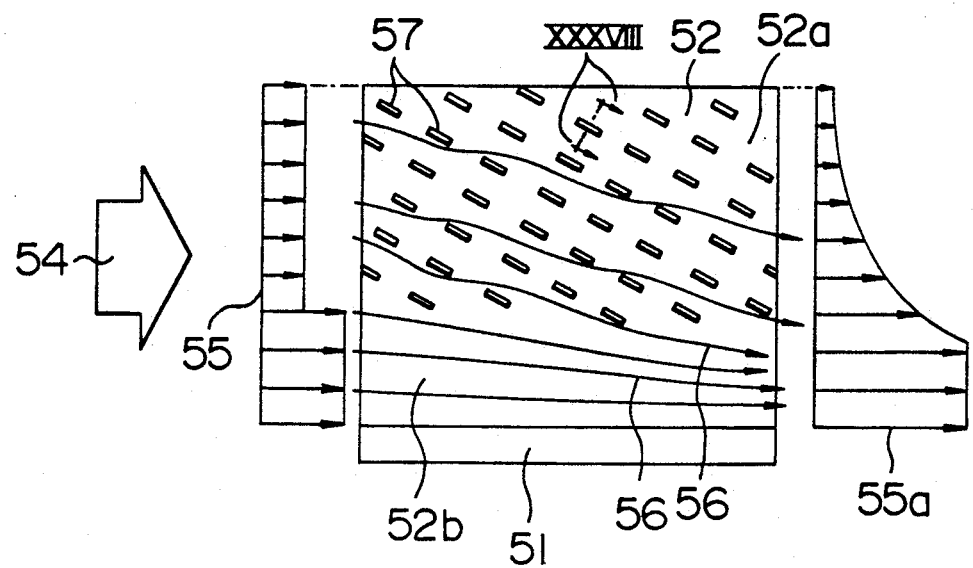
FIG. 37 is a sectional view taken along the line XXXVII—XXXVII of FIG. 36.
Figure 38:
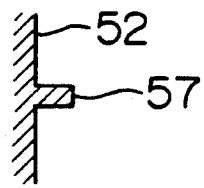
FIG. 38 is a sectional view taken along the line XXXVIII—XXXVIII of FIG. 37.

FIG. 36 shows the construction of a cooling system for cooling a computer or a like heat generating device, employing one of the heat radiation fins of the types described hereinbefore. A plurality of heat sources 51 to be cooled are arranged in series. The cooling system includes heat radiation fins 52 provided on the heat sources 51 and a cooling air duct 53 surrounding the heat radiation fins 52 and the heat sources 51. A cooling fluid 54 such as air is introduced by a blower (not shown) from one end of the duct 53 and is discharged from the other end of the duct. Each heat radiation fin 52 has a construction as shown in FIG. 37 which is a sectional view taken along the line XXXVII—XXXVII of FIG. 36. As will be seen from FIG. 37, each surface of the heat radiation fin 52 has a region 52a adjacent to the free end of the fin in which are formed a group of minute projections 57 which are oriented obliquely downwardly along the flow of the cooling air, and a smooth region 52b near the base end of the fin and devoid of such projections. Each minute projection has, for example, a rectangular cross-section as shown in FIG. 38. The smooth region 52b of the fin occupies a predetermined proportion of the overall height of the fin as measured from the lower end of the fin. From the view point of balance between the effect produced by the provision of the fins and the effect produced by the increase in the cooling air flow rate, it is advisable that the height of the smooth region 52b is ½ or less of the fin height.

The operation of this embodiment is as follows.

Figure 39:
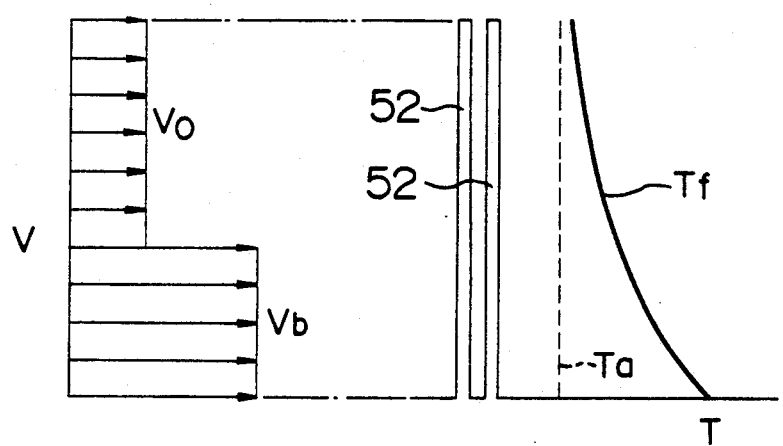
FIG. 39 is an illustration of the operation of an embodiment of the present invention.
Figure 40:
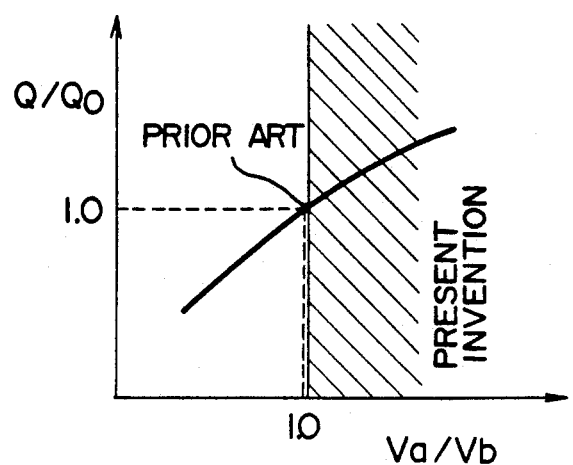
FIG. 40 is an illustration of the effect produced by the present invention.

Referring to FIG. 37, the minute projections 57 contribute not only to the increase in the heat radiation area but also to a reduction in the thickness of the the temperature boundary layer of flow of air so as to enhance the heat transfer from the fin surface to the cooling fluid. The projections 57, however, pose a greater flow resistance than the smooth region 52b. In consequence, the cooling air 54 flowing into the channels between the fins 52 forms a flow velocity distribution 55 at a region immediately upstream of the fins 52. The portion of the air 56 coming into the region 52a of the channel where the inclined projections 57 exist is directed obliquely downward by the inclined projections 57, whereas the portion of the air introduced to the portion of the channel on the smooth region 52b of the fin surface is allowed to flow straight down to the right end of the channel, whereby an air flow velocity distribution 55a is obtained at the downstream end of the fins. FIG. 39 shows the profiles of the mean air flow velocity V in the channel between the fins, cooling temperature Ta and the fin temperature Tf during cooling performed by this cooling system. It will be seen that the fin temperature Tf exhibits such a gradient that the temperature is higher at the base portion than at the free end for a given temperature Ta of the incoming cooling air. In addition, the air flowing velocity V exhibits such a distribution that the greater quantity of air flows into the base portion of the channel where the fin surfaces are smooth than into the region where the projections exist. In consequence, the rate Q of radiation of the heat from the heat radiation fin is increased as compared with the conventional case where the air flowing velocity distribution is uniform (Va/Vb=1), as will be seen from FIG. 40. This tendency is observed also when the total air flow rate is fixed. This is because the difference Tf between the temperature of the upper half portions of the fins where the air flows at the velocity Va and the temperature Ta is small so that the heat radiation at these portions of the fins is small even if a condition of Va<(Va+Vb)/2 (mean flow velocity) is met in the condition shown in FIG. 39.

As has been described, in this embodiment of the present invention, each fin has a smooth base end region which is devoid of the minute projections so that a flow resistance distribution is developed in the heightwise direction of the fin, such that the cooling air flows at a higher velocity in the smooth base region which is adjacent to the base end of the fin. The above-described arrangement of the minute projections 57 is only illustrative. Namely, this embodiment is intended for increasing the flow resistance at the upper region of the fins than at the lower region of the same. Thus, various forms of fins as shown in FIGS. 41 to 46 can be used equally well.

Figure 41:
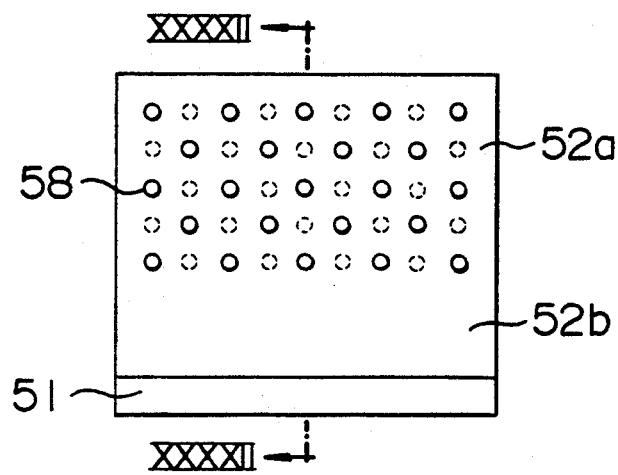
FIGS. 41 to 46 are front elevational views and sectional views of different embodiments.
Figure 42:
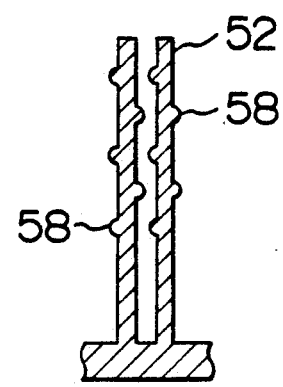

Namely, FIGS. 41 and 42 show an arrangement in which small hemispherical projections 58 are formed in a region 52a of the fin surface other than the smooth region 52b near the base end. It will be seen that the same advantages as those produced by the embodiment shown in FIG. 37 is obtained also in this case.

Figure 43:
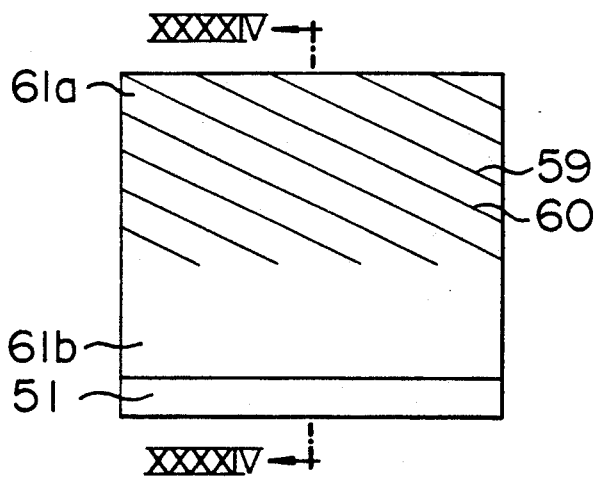
Figure 44:
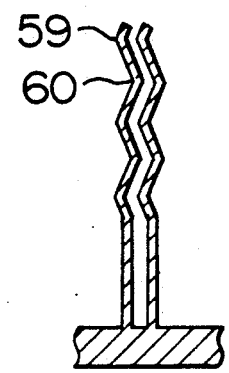

FIGS. 43 and 44 show an arrangement in which the region 61a other than the smooth base region 61b of the fin surface has a consecutive undulation consisting of crests and valleys 59, 60. The undulation increases the flow resistance so that the same advantages are obtained as those produced by the embodiment of FIG. 37.

Figure 45:
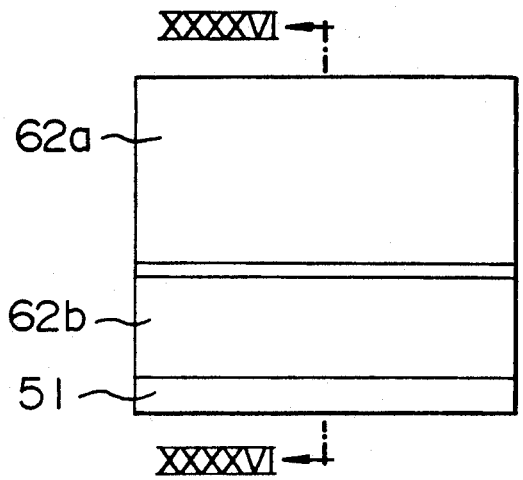
Figure 46:
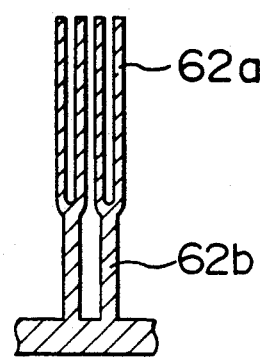

In FIGS. 45 and 46, the fin has a common base portion 62b which is divided into a plurality of upper fin portions 62a. The upper fin portions 62a have tabular forms with flat surfaces but serve to increase the flow resistance at the upper region of the fin due to the increased area of contact with the air which produces greater resistance due to friction. In consequence, the arrangement of FIGS. 45 and 46 also provides the same effect as that produced by the embodiment shown in FIG. 37.

Thus, in the embodiments shown in FIGS. 37 through 46, the cooling air flow velocity is increased particularly at the base end region of the fins where the temperature difference between the air and the fins is large so that the heat radiation rate is remarkably increased.

As will be understood from the foregoing description, the present invention offers the following advantages.

In the first aspect of the present invention, the vertical flow component of cooling air which is still cold is successively merged into the straight flow component of the cooling air so that a large mean temperature difference is developed which, in combination with the collision effect produced by the vertical component and the effect of turbulency formed as a mixing of the flow components, remarkably improves the heat exchanging performance. This effect is equally produced on all portions of the heat source or sources so that an uniform temperature distribution is obtained while suppressing temperature rise of the heat sources.

In the third aspect of the present invention, the mixture flow formed as a result of mixing of the straight flow component and the vertical flow component is guided by the inclined projections formed on the fin surfaces so as to produce mixing effect at the downstream side of the downstream end of the projection which approaches the heat source. In consequence, the heat transfer promotion effect is obtained even in the region of the fin near the heat source which, in combination with the heat transfer area increased as a result of provision of the projections, enhances the heat transfer promotion effect so as to effectively cool the heat sources.

In the fifth aspect of the present invention, mixture of the cooling air is formed by introducing, in addition to the vertical flow component, lateral flow components into the main straight flow component of the cooling air. This arrangement enables the cooling fluid to be supplied at a sufficiently large flow rate so that the heat sources can be effectively cooled without any fins attached thereto.

The sixth aspect of the invention employs guide vanes or plates which forcibly deflect the upper flow component towards the heat sources, thus forming a strong vertical flow component. The guide vanes are adjustable to enable control of the direction of the vertical component such that the vertical flow components substantially perpendicularly impinge upon the surface of the heat source so as to produce a strong collision effect or such that the distribution of the vertical flow component is controlled in the direction of flow of the straight flow component so as to form an optimal pattern of mixture of flow components of the cooling air. In consequence, temperature rise of the heat sources is effectively suppressed and a substantially uniform temperature distribution is developed along the array of the heat sources.

Thus, the present invention provides a cooling system for cooling electronic devices such as LSI chips, capable of effectively suppressing the temperature rise of the devices and making uniform the temperature distribution. The cooling system of the present invention therefore makes it possible to design a high-speed and reliable computer which incorporates elements such as LSI chips mounted at a high mounting density.

Substantially similar effects are obtained also in the case of the electronic device incorporating the cooling system according to the seventh aspect of the invention.

Furthermore, according to the present invention, it is possible to increase the heat radiation area without being accompanied by an increase in the flow resistance encountered with the flow of the cooling fluid, while promoting the mixing of flow components of the cooling fluid and increasing the flow velocity of the cooling fluid particularly at the base regions of the heat radiation fins where the fin temperature is high. It is therefore possible to effectively cool the electronic apparatus and devices such as computers loaded with electronic components at high density.

The minute projections can have a configuration composed of a substantially horizontal upstream portion and a downwardly inclined downstream portion. Such a configuration of the projection effectively promotes the mixing of the vertical flow components into the straight flow component. When the projection is made to have a stream-lined configuration, the flow resistance encountered with the cooling fluid, and the tendency for separation of the layer of the cooling fluid, are effectively reduced.

When the fin panel is composed of a plurality of sections which are arranged in the direction of flow of the cooling fluid at a predetermined interval, it is possible to avoid any unfavorable effect which may otherwise be caused by thermal distortion of the fin panel. In addition, this arrangement makes it possible to arrange the inclined projections such that each projection is located between two adjacent projections on the immediately upstream section of the fin panel. This arrangement reduces the undesirable effect of a temperature boundary layer which is formed on the downstream side of each projection and which may otherwise adversely affect on the projection immediately downstream therefrom. The above-mentioned arrangement of the inclined projections also promotes the mixing of flow components of the cooling fluid so as to contribute to a further increase in the heat transfer efficiency.

When the fins are constructed such that a flow resistance is reduced at the base end region of the fins, it is possible to obtain a greater flow rate of the cooling fluid at the base end region where the temperature difference between the fin and the air is large, whereby the heat transfer efficiency is improved remarkably.

What is claimed is:

1. A cooling system comprising a cooling fluid flow passage having an upstream end and a downstream end in which heat-generating components of an electronic device arranged in series along a major cooling fluid flow path of said cooling fluid flow passage are disposed for cooling said electronic device by allowing a cooling fluid to flow from the upstream end of said flow passage to the downstream end of said flow passage along the major cooling fluid flow path in contact with said heat-generating components, wherein:

said flow passage has, at an upstream end of the heat-generating component arranged closest to the upstream end of said flow passage, a cross-sectional area greater than that of said heat-generating component arranged closest to the upstream end of said flow passage in a plane perpendicular to the major cooling flow path;

said cross-sectional area of said flow passage progressively decreases towards the downstream end of said flow passage; and said flow passage is composed of a main passage configured such that a main flow component of the cooling fluid directly flows into contact with said series of heat-generating components when the cooling fluid flows from the upstream end of aid flow passage to the downstream end of said flow passage and an auxiliary passage configured such that an auxiliary component of the cooling fluid flows towards each of said heat-generating components at an angle with respect to the main flow component when the cooling fluid flows from the upstream end of said flow passage to the downstream end of said flow passage.

2. A cooling system according to claim 1, further comprising supplying means, provided at the upstream end of the cooling fluid flow passage, for supplying the cooling fluid, and a casing including said heat-generating components and heat radiation members attached to said heat-generating components for receiving the cooling fluid from said supplying means.

3. A cooling system according to claim 1, wherein said flow passage is formed by a duct having a top wall and lateral side walls connected to tapered walls which progressively approach said series of heat-generating components towards the downstream end of said flow passage.

4. A cooling system comprising a cooling fluid flow passage having an upstream end and a downstream end in which a series of assemblies composed of heat-generating components of an electronic device arranged in series along a major cooling fluid flow path of said cooling fluid flow passage and heat radiation members connected to said heat-generating components are disposed for cooling said electronic device by allowing a cooling fluid to flow from the upstream end of said flow passage to the downstream end of said flow passage along the major cooling fluid flow path in contact with said heat-generating components, wherein:

said flow passage has, at an upstream end of the assembly arranged closest to the upstream end of said flow passage a cross-sectional area greater than that of said assembly arranged closest to the upstream end of said flow passage in a plane perpendicular to the major cooling fluid flow path;

said cross-sectional area of said flow passage progressively decreases towards the downstream end of said flow passage; and said flow passage is composed of a main passage configured such that a main flow component of the cooling fluid directly flows into contact with the series of assemblies when the cooling fluid flows from the upstream end of said flow passage to the downstream end of said flow passage and an auxiliary passage configured such that an auxiliary component of the cooling fluid flows towards each of said assemblies at an angle with respect to the main flow component when the cooling fluid flows from the upstream end of said flow passage to the downstream end of said flow passage.

5. A cooling system according to claim 4, wherein each one of said heat radiation members includes at least one heat radiation fin provided on said each one of said heat-generating components.

6. A cooling system according to claim 5, wherein at least one surface of said at least one heat radiation fin is provided with at least one inclined projection which is inclined for guiding the cooling fluid towards at least one of said heat-generating components.

7. A cooling system comprising a cooling fluid flow passage having an upstream end and a downstream end in which a series of assemblies composed of heat-generating components of an electronic device arranged in series along a major cooling fluid flow path of said cooling fluid flow passage and heat radiation members connected to said heat-generating components are disposed for cooling said electronic device by allowing a cooling fluid to flow from the upstream end of said flow passage to the downstream end of said flow passage in contact with said heat-generating components, wherein:

said flow passage has, at an upstream end of the assembly arranged closest to the upstream end of said flow passage, a cross-sectional area greater than that of said assembly arranged closest to the upstream end of said flow passage in a plane perpendicular to the major cooling fluid flow path;

said cross-sectional area of said flow passage progressively decreases towards the downstream end of said flow passage; and said flow passage is composed of a main passage configured such that a main flow component of the cooling fluid directly flows into contact with the series of assemblies when the cooling fluid flows from the upstream end of said flow passage to the downstream end of said flow passage and an auxiliary passage configured such that an auxiliary component of the cooling fluid flows towards each of said assemblies at an angle with respect to the main flow component when the cooling fluid flows from the upstream end of said flow passage to the downstream end of said flow passage;

said cooling system further comprising at least one guide vane disposed at an angle in said auxiliary passage such that the auxiliary component of the cooling fluid flows into contact with said at least one guide vane, the angle of said at least one guide vane being adjustable with respect to the auxiliary component of the cooling fluid flowing into contact with said at least one guide vane.

* * * * *